United States Patent [19]

Geerk et al.

[11] 4,335,314
[45] Jun. 15, 1982

[54] GENERATOR FOR PULSED ELECTRON BEAMS

[75] Inventors: Jochen Geerk, Stutensee; Fritz Ratzel, Linkenheim-Hochstetten, both of Fed. Rep. of Germany

[73] Assignee: Kernforschunggszentrum Karlsruhe GmbH, Karlsruhe, Fed. Rep. of Germany

[21] Appl. No.: 175,833

[22] Filed: Aug. 5, 1980

[30] Foreign Application Priority Data

Apr. 12, 1980 [DE] Fed. Rep. of Germany ....... 3014151

[51] Int. Cl.$^3$ .............................................. H01J 3/00
[52] U.S. Cl. ........................... 250/492.3; 219/121 ET
[58] Field of Search ............... 250/492 B, 492 A, 396, 250/398; 219/121 ET, 121 EA, 121 EB; 315/234, 261, 263, 330, 335

[56] References Cited

U.S. PATENT DOCUMENTS

| | | | |
|---|---|---|---|
| 2,924,714 | 2/1960 | Davis et al. | 219/121 ET |
| 3,049,608 | 8/1962 | Greene | 219/121 ET |
| 3,624,445 | 11/1971 | Cadwallader | 315/234 |
| 3,646,394 | 2/1972 | Swartz et al. | 315/330 |
| 3,678,334 | 7/1972 | Dugdale et al. | 219/121 ET |

OTHER PUBLICATIONS

"100 G.W. Electron Beam Generator", Harris et al., *IEEE Trans. on Nuclear Science,* No. 5, 10-76, pp. 1470-1477.

*Primary Examiner*—Bruce C. Anderson
*Attorney, Agent, or Firm*—Spencer & Kaye

[57] ABSTRACT

A generator for pulsed electron beams of the type including a vacuum chamber for performing high voltage discharges, cathode and anode electrodes, for irradiating a sample with accelerated charge carriers, provided in the vacuum chamber, and a first high voltage capacitor connected between the cathode and anode electrodes to serve as the voltage source for the high voltage discharge between the electrodes. The generator is further provided with an arrangement for generating an auxiliary discharge which initiates the discharge process between the cathode and the anode electrodes, which arrangement includes a trigger electrode and a second high voltage capacitor which can be connected between the cathode electrode and the trigger electrode as an energy source for the auxiliary discharge; the distance between the cathode electrode and the trigger electrode being such that when the second or trigger capacitor is conductively connected between the trigger and cathode electrodes, a sparkover is produced therebetween, causing a trigger plasma to be formed which initiates the high voltage discharge. Moreover, the cathode electrode is provided with a central bore through which the trigger plasma can exit into the discharge chamber formed between the cathode and anode electrodes; and the anode is a metal network or net which is highly transparent to electrons and through which fly the electrons accelerated by the electric field existing between the cathode and anode electrodes due to the voltage of the first or main capacitor. Preferably the sample carrier, which is disposed on the side of the anode electrode facing away from the cathode electrode, is mounted so that it is adjustable along the axis of the electrode system.

11 Claims, 3 Drawing Figures

GENERATOR FOR PULSED ELECTRON BEAMS

BACKGROUND OF THE INVENTION

The present invention relates to a generator for pulsed electron beams. More particularly the present invention relates to an improved generator for pulsed electron beams which is particularly applicable for the tempering or annealing of solid surfaces.

In recent years, the short-time annealing or solid state surfaces, particularly semiconductors and metals, has become one of the important preparation methods in materials technology. This type of annealing is usually effected by light pulses of a duration of about 100 ns which are generated by lasers. This method of laser annealing (LA) is utilized inter alia to anneal radiation damage in implanted semiconductor crystals. The advantage of short-time processing in such implanted semiconductor crystals, compared to conventional baking in annealing furnaces, is mainly that, due to the short period of application of the light flash it is possible to completely anneal radiation damage but avoid a diffusion of the implanted foreign atoms. Thus in many semiconductors, the application of laser annealing (LA) has yielded foreign atom concentrations which are higher by orders of magnitude than it was possible with processing in the annealing furnace.

The properties of many semiconductor devices can be improved if short-time annealing is used during their manufacture. This applies, in particular, to solar cells. While defects or impurities may travel from the interior of the semiconductor crystal to the surface into the light-sensitive layer of the solar cell during long-term baking in a furnace, and thus considerably degrade the degree of efficiency of the cell, this is not the case with LA in which only the surface, i.e., the first several $\mu m$ of the crystal surface, is heated. Solar cells produced by means of LA therefore have an increased efficiency over the entire wavelength range.

The drawbacks of LA are mainly that the laser radiation is coupled into the semiconductor to be annealed in a greatly differing manner, namely in dependence on the type and concentration of the dopant. LA becomes particularly difficult when used with metals which often reflect up to 95% of the laser light.

Short-time annealing independent of conductivity and reflectivity can be realized by the use of pulsed electron beams. The thickness of the surface layer being heated up is closely correlated to the penetration depth of the electrons, which again depends directly on the impinging energy of the electrons. For annealing implanted surfaces of a thickness of several 100 nm, the impinging energy should lie in a range between 10 and 20 keV. Since the deposited pulse energy required for melting lies in the approximate range around 1 Joule/cm$^2$, e.g., 1-3 Joule/cm$^2$ for silicon, current densities of the electron beam of about 1000 to 3000 A/cm$^2$ result with a 100 ns pulse duration.

A generator for pulsed electron beams is known, e.g. see IEEE Transactions on Nuclear Science, Vol. NS23, No. 5, October 1976, pages 1470–1477. However, this known generator for pulsed electron beams operates with a field emission plasma diode. The drawbacks of this prior art device are in particular that plasma diodes furnish homogenous and reproducible electron beams only if they are operated at voltages of at least several 100 kV. This is the case because in a plasma diode the electron emitting plasma layer is formed by gases which are generated by evaporation from many whiskers protruding from the cathode surface. These whiskers are vaporized by the Joule heat generated by their own field emission current. A large-area, reproducible whisker evaporation requires electrical field intensities of 200 kV/cm.

Another drawback of this prior art generator is that the operating voltage must be applied to the plasma diode within the very short time of 10 to 15 ns. This requires the use of gas discharge switches with very low inductance between the plasma diode and the energy store which comprises a coaxial capacitor filled with water as the dielectric material.

SUMMARY OF THE INVENTION

It is the object of the present invention to provide a device for generating homogeneous and reproducible pulsed electron beams even at acceleration voltages which are smaller by an order of magnitude than those of prior art devices, and which does not require a gas discharge switch for shutting off the energy source in the discharge path of the generator.

Generally the above object is achieved according to the present invention by providing an improved generator for pulsed electron beams of the type including a vacuum chamber, a sample carrier for receiving a sample to be subjected to electron radiation mounted in the vacuum chamber, a cathode electrode and an anode electrode mounted in this vacuum chamber for emitting and accelerating charge carriers and with the anode electrode being disposed between the cathode electrode and the sample carrier, and a first high voltage or main capacitor connected between the cathode electrode and the anode electrode to serve as the voltage source for a high voltage discharge, in this particular case for a metal vapor discharge, between the cathode and anode electrodes. The generator is improved according to the invention in that the generator further comprises means for generating an auxiliary discharge to initiate the discharge process between the cathode and anode electrodes with these means including a trigger electrode mounted in the vacuum chamber adjacent to and coaxial with the cathode electrode and opposite the anode electrode, and a second high voltage or trigger capacitor, which serves as a voltage source for the auxiliary discharge, connected between the cathode electrode and the trigger electrode by means of a normally open switch, and with the distance between the cathode electrode and the trigger electrode being such that when the second capacitor is connected between same, by closing of the switch, a sparkover is produced between the trigger electrode and the cathode electrode to cause a trigger plasma to be formed which initiates the high voltage discharge between the cathode and anode electrodes; and wherein: the cathode electrode has a central bore through which the trigger plasma can exit into the discharge chamber formed between the cathode and anode electrodes; the anode electrode is a metal network which is highly transparent to electrons and through which fly the electrons which have been accelerated by means of the electric field existing between the cathode and anode electrodes due to the voltage of the first capacitor applied therebetween.

Preferably either or both the sample carrier and the anode electrode are mounted so that their position is adjustable along the axis of the cathode electrode so that their relative spacing from the cathode can be varied.

The advantages over the prior art device realized with the measures according to the present invention lie mainly in that due to the reduction of the required high voltage, which has been reduced by an order of magnitude over the prior art device, costs are reduced considerably, the low-induction gas switch is eliminated since the acceleration voltage can be applied directly to the cathode, and the processes of generating the plasma layer and the acceleration voltage are independent of one another and thus the energy of the electron beam can be adjusted over a very wide range.

DETAILED DESCRIPTION OF THE PREFERRED EMBODIMENTS

Figure 1:
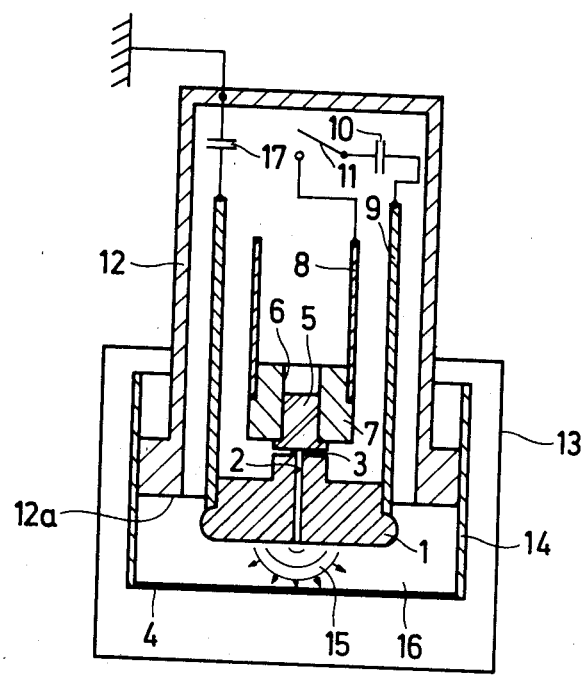
FIG. 1 is a schematic representation of the electrode arrangement of an electron beam generator according to one embodiment of the invention.

The basic arrangement of the electrodes of the electron beam generator according to the invention is illustrated schematically in FIG. 1 wherein there is shown a disc-shaped cathode 1 having a central bore 2. Into this bore 2, there is inserted a metal tube 3 which protrudes by a few millimeters from the cathode 1 on the side facing away from the anode 4. This free end of the tube 3 contacts a graphite solid cylinder 5 which is disposed in a bore 6 of a cylindrical trigger electrode 7 and forms a part of same. Cathode 1 is machined from aluminum and has been polished on its surface facing the anode 4.

The trigger electrode 7 is connected to a first supporting tube or pipe 8 and the cathode 1 is connected to a second supporting tube or pipe 9 which is coaxial with the first supporting tube or pipe 8. A high voltage trigger capacitor 10, which serves as a energy source for an auxiliary discharge, has one of its terminals permanently connected to the second supporting tube or pipe 9 for the cathode 1 and its other terminal connected, via a normally open switch 11, to the first supporting tube 8 accomodating the trigger electrode 7 and the graphite cylinder 5. The second supporting tube 9 is enclosed by a coaxial protective tube or pipe 12 which is at ground potential and which is sealed at its upper end and has its open lower end inserted in a vacuum tight manner into a vacuum chamber 13 enclosing the electrode arrangement. The trigger capacitor 10 is charged to voltages between 5 and 30 kV.

A tubular anode carrier 14 is disposed, in a manner to be displaceable in the axial direction, on the end of the protective tube 12 which extends into the vacuum chamber 13. In the illustrated embodiment, the axial movement of the tubular anode carrier 14 is achieved as result of its sliding engagement with the laterally extending flange 12a of the protective tube 12. The free end of the anode carrier 14 is terminated by the anode 4 which consists of a metal network or net which is highly transparent to electrons.

If the trigger capacitor 10 is connected to the trigger electrode 7 by closing of the switch 11, an arc-over and hence a plasma discharge is produced at the point of contact between the tube 3 passing through the cathode 1 and the graphite cylinder 5. The trigger plasma 15 passes through the tube 3 into the discharge chamber 16 between the cathode 1 and the anode 4 and here actuates a vacuum discharge. A high voltage main capacitor 17, which serves as the energy source for high voltage discharge, is connected between the cathode 1 and the anode 4 and precharged to a voltage corresponding to the required electron energy, e.g. $V = -20$ kV. The capacitor 17 generates an electric field in the discharge chamber 16 so that a beam of electrons is accelerated from the cloud of the trigger plasma 15 toward the anode 4.

In order to maintain the charge equilibrium, positive ions are simultaneously extracted from the trigger plasma in the direction toward the cathode 1. This causes cathode arcing spots to be formed which deliver the necessary electrons and the quantity of gas (in this case metal vapor) to form the plasma during the subsequent vacuum plasma discharge. These spots on the cathode surface are usually produced at points where the current density of the ions extracted from the diffuse trigger plasma 15 is particularly high. As a result, these points are heated considerably and, due to such processes as thermionic field emission and Schottky enhanced thermionic emission, they become intensive electron sources. The outflowing electrons compensate the space charge of the drawn ion beam so that its intensity and therfore again intensity of the emitted electron current increase. The electron current density at the spot may reach values up to $10^7$ A/cm$^2$. Since the currents, due to their inherent magnetic fields, decrease in their geometric cross sections (self pinching), the total current of a cathode spot will hardly exceed values of 100 A. Therefore many cathode spots exist simultaneously during vacuum discharges with high current (e.g. 10,000 A). This is possible because, in contradistinction to usual gas discharges, the cathode spots of vacuum discharges exhibit a current/voltage characteristic with a positive slope. The metal vapor produced at the cathode spots flows with a velocity of about $10^6$ cm/s into the discharge chamber 16 between the cathode 1 and the anode 4 and, from the many electrons, extracted from the spots, is in this way converted into a plasma having a high electron density. From the anode side interface of this plasma, which moves toward the anode 4 with the velocity of flow of the metal vapor, electrons are extracted in the direction of the anode 4. Since only voltages of less than 100 V are encountered at the cathode spots, these electrons receive practically all of the energy corresponding to the charging voltage of the main capacitor 17. However, this applies only as long as the plasma-vacuum interface has not yet reached the anode 4. When it does, the entire discharge chamber 16 between the anode 4 and the cathode 1 is filled with a highly conductive plasma and any residual energy still remaining in the main capacitor 17 is emitted, for example, in the form of radiation of high frequency electromagnetic waves.

The extracted electrons fly through the highly transparent metal net forming the anode 4 and are available for irradiation of the sample. The capacitors 10 and 17 are preferably high voltage oil insulated capacitors with coaxial terminals and coaxial arrangement of their inner electrodes.

Figure 2:
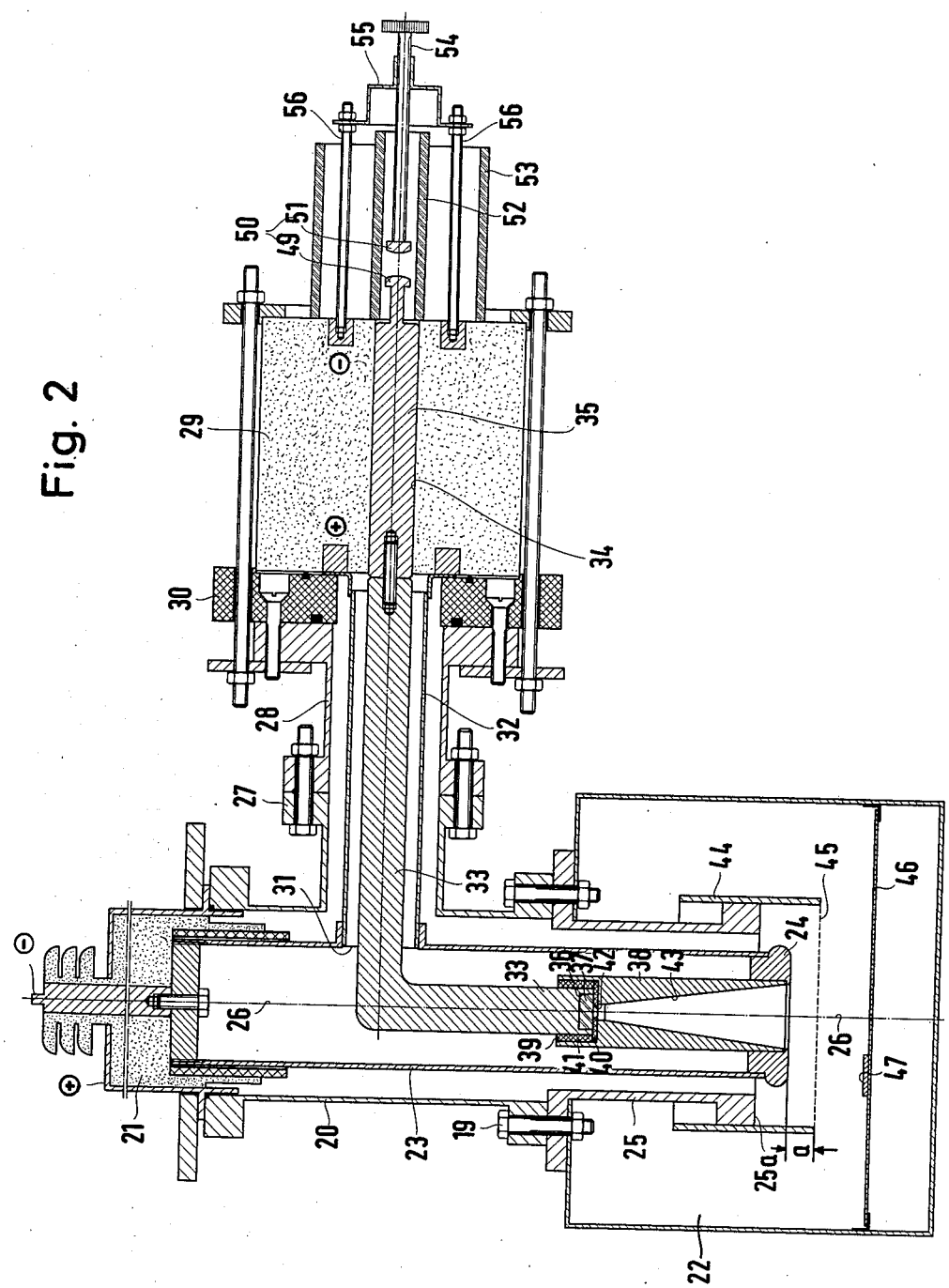
FIG. 2 is a sectional view of a preferred embodiment of an electron beam generator according to the invention with a main and a trigger capacitor.

The cross section of an electron beam generator according to the preferred embodiment of the invention with independent energy sources for triggering the discharge process and accelerating the electrons is shown in FIG. 2. As shown, a first protective tube 20, which is connected to ground potential, has one of its ends connected to the outer coaxial terminal of a high voltage main capacitor 21 of the wound paper type, and its other end connected, in a vacuum-tight manner, to a wall of a vacuum chamber 22 by means of bolts 19.

Disposed within and coaxial with the first protective tube 20 is a cathode tube 23 which has one of its ends connected to the inner coaxial terminal of the main capacitor 21 and its other end connected to an annular cathode disc 24 which is disposed within the vacuum chamber 22. The portion of the cathode tube 23 which extends into the vacuum chamber 22 is coaxially enclosed by a tubular supporting device 25 which is connected to the wall of the vacuum chamber 22 by means of the bolts 19 and forms an extension of the tube 20.

In the region between the main capacitor 21 and the vacuum chamber 22, the first protective tube 20 is provided with a flange 27, which is offset by 90° with respect to the axis 26 of the first protective tube 20, and to which a second protective tube 28 is connected in a suitable vacuum tight manner. The second protective tube 28 supports the trigger capacitor 29 for the generator. The capacitor 29 is mounted on the second protective tube 28 by means of an insulating ring 30 in a manner so that the capacitor 29 is electrically insulated from the tube 28. The cathode tube 23 is provided with an opening or passage 31 which is coaxial with the flange 27 and the second protective tube 28 and to which is connected a tube 32 which is disposed concentrically with the flange 27 of the first protective tube 20 and the protective tube 28. The tube 32 is connected to one terminal of the trigger capacitor 29 and forms the outer coaxial conductor for same. A solid inner conductor 33, which is electrically connected to the other terminal of the capacitor 29 in a manner to be described below, is disposed coaxially with the outer conductor 32 and is electrically conducting and mechanically connected with a bolt 35 which extends through a central bore 34 in the trigger capacitor 29.

After passing through the passage 31, the inner conductor 33 is bent at a right angle and brought coaxially with the longitudinal axis 26 of the electrode system in the direction toward the cathode disc 24. The end of the inner conductor 33 facing the annular cathode 24 is provided with a central bore 36 into which a graphite disc 37 has been inserted.

Instead of the tube 3 of FIG. 1, in this embodiment, the cathode disc 24 is provided with a metal connecting member or extension 38 which is inserted into and contacts the annulus of the cathode disc 24 and extends to the inner conductor 33. At its end facing the inner conductor 33, the cathode connecting member or extension 38 is provided with a bore 39 whose plane bottom is covered with an insulating disc 40 and whose walls are covered by an insulating sleeve 41 so that the end of the inner conductor 33 which has been introduced into the insulating sleeve 41 is electrically insulated from the connecting member 38 of the cathode disc 24. The insulating disc 40 is provided with a central through bore 42 so that at least a portion of the surface of the graphite disc 37 is exposed. The connecting member 38 is provided with a central through bore 43 which is conically widened in the direction toward the cathode disc 24.

In this embodiment of the electron beam generator, in contradistinction to the schematic illustration of FIG. 1, the graphite disc 37 does not contact the cathode connecting member or extension 38. However, the spacing or distance between the graphite disc or trigger electrode 37 and the cathode 24, or more specifically the metal connecting member or extension 38 of the cathode, is still such that an arc will be produced between the disc 37 and the member 38 to cause the trigger plasma which initiates the high voltage discharge to be formed when the capacitor 29 is connected to the electrode system. In particular, in this embodiment the triggering discharge arcs between the trigger electrode 37 and member 38 through the central bore 42 provided in the thin insulating disc 40.

A tubular anode carrier 44 is arranged on the tubular supporting device 25, and in particular on the laterally extending flange 25a of the device 25 to be displaceable in the direction of the longitudinal axis 26. One end of this anode carrier 44 is terminated by a highly transparent metal network which forms the net anode 45 and permits setting of a predetermined distance a between the surface of the cathode disc 24 and the net anode 45. Disposed within the vacuum chamber 22 on the side of the net anode 45 facing away from the cathode disc 24, is a sample carrier 46 for receiving a sample 47 to be irradiated with electrons of a predetermined energy. The sample carrier 46 is supported on the inner surface of the side walls of the vacuum chamber 22 in any conventional manner so that it is adjustable with respect to the axis 26 and thus to the electron beam.

The bolt 35 which passes through the central bore 34 of the trigger capacitor 29 in a vacuum tight manner is designed, on the frontal face facing away from the inner conductor 33, as the stationary contact 49 of a normally open switch 50 which is provided with a slide contact 51 electrically connected to the remaining terminal of the trigger capacitor 29. The contacts 49 and 51 of the switch 50 are disposed in an insulating sleeve 52 which is concentrically disposed within a further insulating sleeve 53 mounted on the end of the capacitor 29. The contact 51 forms the end of a plunger 54 which is slidably mounted in a member 55 for movement along its longitudinal axis. The member 55 is in turn mounted on and electrically connected with a plurality of posts 56 which extend between the insulating sleeves 52 and 53 into the capacitor 29 and constitute the inner terminal of same.

In operation, depression of the plunger 54 closes the contacts 49 and 51 of the switch 50 and, via the bolt 35 and the inner conductor 33, connects the terminals 56 of capacitor 29 to the graphite disc or trigger electrode 37, resulting in the trigger discharge between electrode 37 and the cathode connecting member 38 and initiating the trigger plasma. The desired pulsed electron beam thereafter results as generally described above with respect to FIG. 1.

Figure 3:
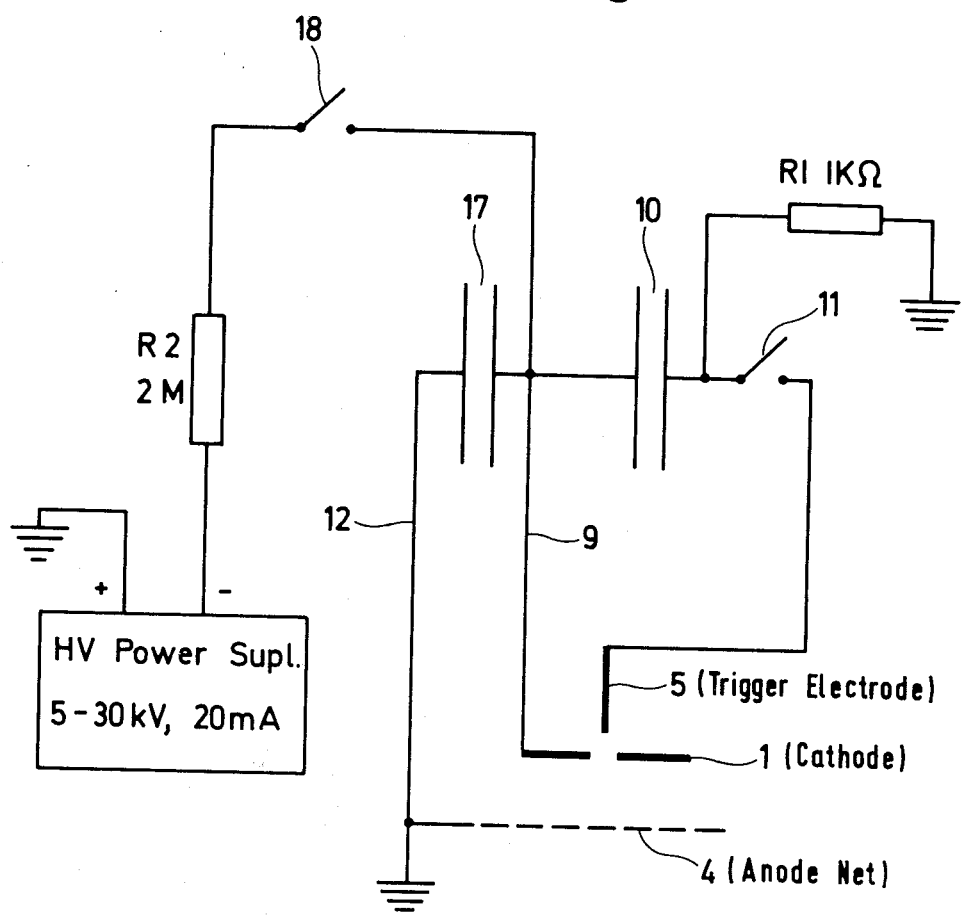
FIG. 3 is a schematic representation of the electrical arrangement used for charging the main and the trigger capacitor. The notations refer to those used in FIG. 1.

In FIG. 3 the electrical arrangement for charging the main capacitor 17 and the trigger capacitor 10 is shown. The numbers are referring to those used in FIG. 1. The electrode of the trigger capacitor 10, which is facing switch 11, is connected to ground potential permanently via the resistor R1. Via switch 18 and R2 pipe 9 is connected, using a high voltage insulating cable, to the negative output of a DC high voltage power supply. This power supply is a commercially available one providing an output voltage variable between 5 and 30 kV and providing a maximum current of 20 mA. In order to charge the capacitors 17 and 10, switch 11 is opened and switch 18 is closed. Within a few seconds both capacitors are charged to the voltage set at the high voltage power supply. Then switch 18 is opened and the discharge can be initiated by closing switch 11 as described before. As the resistance value of R1 is much higher than the resistances involved in the discharge paths R1 does not affect neither the trigger discharge nor the main discharge. The electrical arrangement shown in FIG. 3 is unique for its simplicity as only one switch (18) is used to charge both capacitors. If the capacitors 17 and 10 have to be charged to different voltages, the charging arrangement gets more complicated. The electron beam generator described in the present invention works well using the electrical charging arrangement described in FIG. 3, where the trigger and the main capacitor are always charged to the same voltage.

It is to be understood that the above description of the present invention is susceptible to various modifications, changes and adaptations, and the same are intended to be comprehended within the meaning and range of equivalents of the appended claims.

What is claimed is:

1. In a generator for pulsed electron beams including: a vacuum chamber; a sample carrier for receiving a sample to be subjected to accelerated electron radiation mounted in said vacuum chamber; spaced cathode and anode electrodes for emitting charge carriers and for accelerating charge carriers mounted in said vacuum chamber with said anode electrode being disposed between said cathode electrode and said sample carrier; a first high voltage capacitor connected between said cathode electrode and said anode electrode to serve as the energy source for a high voltage discharge, particularly for a metal vapor discharge between said cathode and anode electrodes, and means for generating an auxiliary discharge which initiates the discharge process between said cathode and anode electrodes, said means including a trigger electrode mounted in said vacuum chamber adjacent to and coaxial with said cathode electrode on the side of same opposite said anode electrode, and a second high voltage capacitor, which serves as a voltage source for the auxiliary discharge, connected between said cathode electrode and said trigger electrode by means of a normally open switch; the improvement further comprising a first protective metal tube which is connected to ground potential, is closed at one end and has its other end extending into said vacuum chamber in a vacuum tight manner to approximately the level of said cathode electrode, a second metal tube disposed within and coaxial with said first tube, and a metal conductor disposed within said coaxial with said second tube; and wherein:

the distance between said cathode electrode and said trigger electrode is such that when said second capacitor is connected between same by closing of said switch, a sparkover is produced between said trigger electrode and said cathode electrode and causes a trigger plasma to be formed which initiates said high voltage discharge between said cathode and anode electrodes; said cathode electrode is mounted on one end of said second tube in an electrically conductive manner and has a central bore through which the trigger plasma can exit into the discharge chamber formed between said cathode and anode electrodes; said trigger electrode is mounted on the end of said metal conductor which faces said cathode electrode in an electrically conductive manner; said anode electrode is mounted on said other end of said first tube in an electrically conductive manner and is a metal network which is highly transparent to electrons and through which fly the electrons which have been accelerated by means of the electric field existing between said cathode and anode electrodes due to the voltage of said first capacitor applied therebetween; said first capacitor has one terminal conductively connected to said one end of said first tube and its other terminal conductively connected to the other end of said second tube; and said second capacitor has one terminal conductively connected to said second tube and its other terminal connected via said switch to said metal conductor.

2. A generator as defined in claim 1 wherein: said metal conductor is a third tube; said trigger electrode is a metal cylinder having a through bore in which is mounted a solid cylinder of graphite; and said cathode electrode has a metal tube mounted in and extending through its said central bore and into contact with said solid cylinder of graphite.

3. A generator as defined in claim 1 wherein: said anode electrode is mounted on said first tube via a metal tubular anode carrier with said anode electrode being disposed across one end of said anode carrier; and means are provided for mounting the other end of said anode carrier on said other end of said first tube in a manner such that said anode carrier is displaceable along its longitudinal axis, whereby the axial spacing between said anode and cathode electrodes can be adjusted.

4. In a generator for pulsed electron beams including: a vacuum chamber, a sample carrier for receiving a sample to be subjected to accelerated electron radiation mounted in said vacuum chamber, spaced cathode and anode electrodes for emitting charge carriers and for accelerating charge carriers mounted in said vacuum chamber with said anode electrode being disposed between said cathode electrode and said sample carrier, and a first high voltage capacitor connected between said cathode electrode and said anode electrode to serve as the energy source for a high voltage discharge, particularly for a metal vapor discharge between said cathode and anode electrodes; the improvement comprising:

means for generating an auxiliary discharge which initiates the discharge process between said cathode and anode electrodes, said means including a trigger electrode mounted in said vacuum chamber adjacent to and coaxial with said cathode electrode on the side of same opposite said anode electrode, and a second high voltage capacitor, which serves as a voltage source for the auxiliary discharge, connected between said cathode electrode and said trigger electrode by means of a normally open switch;

the discharge between said cathode electrode and said trigger electrode is such that when said second capacitor is connected between same by closing of said switch, a sparkover is produced between said trigger electrode and said cathode electrode and causes a trigger plasma to be formed which initiates said high voltage discharge between said cathode and anode electrodes;

said cathode electrode has a central bore through which the trigger plasma can exit into the discharge chamber formed between said cathode and anode electrodes;

said anode electrode is a metal network which is highly transparent to electrons and through which fly the electrons which have been accelerated by means of the electric field existing between said cathode and anode electrodes due to the voltage of said first capacitor applied therebetween;

a protective first tube which is connected to ground potential and has one end closed by said first capacitor and electrically connected to an outer coaxial terminal of said first capacitor and its other end connected to a wall of said vacuum chamber in a vacuum tight manner and enclosing an opening in said wall;

a metal cathode tube which is coaxial with and within said first tube and has one end electrically connected to an inner coaxial terminal of said first capacitor and its other end connected to said cathode electrode which is substantially annular in shape, a portion of said cathode tube extending into said vacuum chamber;

a metal tubular supporting device connected to said wall of said vacuum chamber in a vacuum tight manner and forming an extension of said first tube, said tubular supporting device extending into said vacuum chamber and concentrically surrounding said portion of said cathode tube, whereby said first tube and said tubular supporting device constitute the outer conductor of a coaxial line whose inner conductor is constituted by said cathode tube;

an opening with a circular outer flange provided in the wall of said first tube in the region of same between said first capacitor and said vacuum chamber, the longitudinal axis of said flange being offset by 90° with respect to the longitudinal axis of said first tube;

a second metal tube coaxially mounted on and electrically connected to said flange, said second capacitor being mounted on the free end of said second tube via an insulating ring so that said second capacitor is electrically insulated from said second tube;

a passage formed in said cathode tube concentrically with said flange of said first tube;

a third metal tube having one end mounted in said passage and electrically connected to said cathode tube and its other end connected to a terminal of said second capacitor;

a solid conductor arranged coaxially with said third tube and electrically connected with one end of a bolt which passes through a central bore in said second capacitor and has its other end electrically connected via said switch to the other terminal of said second capacitor, whereby said third tube and said solid conductor constitute the outer and inner conductors of a coaxial line for said second capacitor, said solid conductor passing through said passage in said cathode tube and thereafter being bent at a right angle so that it extends coaxially with said axis of said cathode tube in the direction toward said cathode electrode; and, said trigger electrode is conductively mounted on the end of said solid conductor facing said cathode electrode.

5. A generator as defined in claim 4 wherein said other end of said bolt forms the stationary contact of said switch for connecting said second capacitor to said trigger electrode.

6. A generator as defined in claim 1 or 4 wherein:

said end of said metal conductor facing said cathode electrode is provided with an axial bore;

said trigger electrode is a graphite disc which is mounted in said axial bore of said metal conductor;

said cathode electrode is provided with a cylindrical metal extension member having one end disposed in the central bore of said cathode electrode and its other end extending to said one end of said metal conductor;

said one end of said metal conductor with said graphite disc is inserted into a first axial bore in said other end of said metal extension member;

said extension member is electrically insulated against said metal conductor by means of a member of insulating material including a sleeve disposed between the peripheral surface of said metal conductor and the adjacent wall of said first axial bore of said metal extension member, and a disc which covers the end surface of said metal conductor as well as the free surface of said graphite disc;

said disc of insulating material is provided with a central through bore; and said extension member is provided with a second axial through bore which communicates with said graphite disc via said bore in said disc of insulating material.

7. A generator as defined in claim 6 wherein said second axial bore of said extension member is conically widened in a direction toward said cathode electrode.

8. A generator as defined in claim 4 wherein: said anode electrode is mounted on said supporting device via a metal tubular anode carrier with said highly transparent metal network which forms said anode electrode terminating one end of said anode carrier; and means are provided for mounting the other end of said anode carrier on said supporting device in a manner such that said anode carrier is displaceable along its longitudinal axis so that the axial distance between said cathode electrode and said anode electrode can be adjusted by displacement in the direction of said axis.

9. In a generator for pulsed electron beams including: a vacuum chamber, a sample carrier for receiving a sample to be subjected to accelerated electron radiation mounted in said vacuum chamber, spaced cathode and anode electrodes for emitting charge carriers and for accelerating charge carriers mounted in said vacuum chamber with said anode electrode being disposed between said cathode electrode and said sample carrier, and a first high voltage capacitor connected between said cathode electrode and said anode electrode to serve as the energy source for a high voltage discharge, particularly for a metal vapor discharge between said cathode and anode electrodes; the improvement wherein:

said generator further comprises means for generating an auxiliary discharge which initiates the discharge process between said cathode and anode electrodes, said means including a trigger electrode mounted in said vacuum chamber adjacent to and coaxial with said cathode electrode on the side of same opposite said anode electrode, and a second high voltage capacitor, which serves as a voltage source for the auxiliary discharge, connected between said cathode electrode and said trigger electrode by means of a normally open switch;

the distance between said cathode electrode and said trigger electrode is such that when said second capacitor is connected between same by closing of said switch, a sparkover is produced between said trigger electrode and said cathode electrode and causes a trigger plasma to be formed which initiates said high voltage discharge between said cathode and anode electrodes;

said cathode electrode includes an annular cathode disc, which is connected to said first high voltage capacitor via its peripheral surface, and a coaxial metal extension member which is connected to said cathode disc, extends from said cathode disc toward said trigger electrode and is provided with a through bore which is conically widened in a direction toward said cathode disc; and said anode electrode is a metal network which is highly transparent to electrons and through which fly the electrons which have been accelerated by means of the electric field existing between said cathode and anode electrodes due to the voltage of said first capacitor applied therebetween.

10. A generator as defined in claim 1, 4 or 9 wherein the position of said sample carrier along the axis of the said cathode electrode, and thus with respect to the generated electron beam, is adjustable.

11. A generator as defined in claim 9 wherein said first capacitor and said second capacitor are each paper capacitors which are provided with coaxial terminals which are connected to respective first and second coaxial lines each including an inner conductor and an outer conductor.

* * * * *